United States Patent [19]

Stengl et al.

[11] Patent Number: 4,859,857
[45] Date of Patent: Aug. 22, 1989

[54] ION-PROJECTION APPARATUS AND METHOD OF OPERATING SAME

[75] Inventors: Gerhard Stengl, Villach; Hans Löschner; Peter Wolf, both of Vienna, all of Austria

[73] Assignee: IMS Ionen Mikrofabrikations Systeme Gesellschaft, Wien, Austria

[21] Appl. No.: 9,414

[22] Filed: Jan. 30, 1987

[30] Foreign Application Priority Data

Jan. 31, 1986 [AT] Austria .............................. A 237/86

[51] Int. Cl.$^4$ ............................................. H01J 37/08
[52] U.S. Cl. .................... 250/492.3; 250/398; 250/396 ML
[58] Field of Search ....... 250/396 ML, 396 R, 492.21, 250/492.24, 398

[56] References Cited

U.S. PATENT DOCUMENTS

| | | | |
|---|---|---|---|
| 2,919,381 | 12/1959 | Glaser | 250/396 R |
| 2,973,433 | 2/1961 | Kramer | 250/306 |
| 3,845,312 | 10/1974 | Allison | 250/398 |
| 4,090,077 | 5/1978 | Anger | 250/396 R |
| 4,362,942 | 12/1982 | Yasuda | 250/398 |

FOREIGN PATENT DOCUMENTS

| | | |
|---|---|---|
| 3345573 | 6/1972 | Fed. Rep. of Germany . |
| 220452 | 3/1982 | Fed. Rep. of Germany . |
| 3010815 | 11/1983 | Fed. Rep. of Germany . |
| 1597596 | 1/1970 | United Kingdom . |

OTHER PUBLICATIONS

Ion Projection Microlithography; G. Stengl; R. Kaitna; H. Loschner; R. Rieder; P. Wolf; R. Sacher; pp. 104-109.

Primary Examiner—Bruce C. Anderson

[57] ABSTRACT

A multipole corrective element with the individual poles being electromagnetically energized individually and selectively to create a variable field around a charged particle beam projected through a mask and a lens system onto a substrate, e.g. an ion-beam or electron-beam microlithography. The corrective element is provided independently of the ion-optical lens system between the latter and the mask, preferably proximal to the mask.

23 Claims, 2 Drawing Sheets

ION-PROJECTION APPARATUS AND METHOD OF OPERATING SAME

CROSS-REFERENCE TO RELATED APPLICATIONS

This application is related to the commonly assigned copending applications:
Ser. No. 06/930,806 filed 13 Nov. 1986;
Ser. No. 06/930,805 filed 13 Nov. 1985;
Ser. No. 06/930,812 filed 13 Nov. 1986;
Ser. No. 06/930,807 filed 13 Nov. 1986;

FIELD OF THE INVENTION

Our present invention relates to a projection system utilizing charged particles and, more particularly, to a projection apparatus and a method of operating it, wherein a beam of charged particles traverses a mask whose structure is to be imparted to a substrate and, after passing through the mask, traverses an electromagnetic lens system which can be a collimating and/or focusing lens system,, before impinging upon the substrate. The invention is particularly applicable to demagnifying projection systems of this type which are used to structure semiconductor chips used in the electronics industry.

BACKGROUND OF THE INVENTION

Projection using electrically charged particles, especially ions, can be used to form an image of the structure of a mask upon a substrate, e.g. a chip which can be utilized in the electronics industry. High accuracy is required in such systems and, for example, a plurality of exposures must be made through respective masks which must be superimposed upon one another with a high degree of precision so that the images formed on the substrate will be superimposed with high accuracy as well. The requirements for such projection systems in terms of tolerances and the like are thus high.

Nevertheless, there is a significant possibility that structure errors will be transmitted to the substrate, such errors arising from a variety of sources. For example, there may be errors in the structure of the mask whose image is to be imparted to the substrate. A typical fault of this type can include a line of the structure which is not precisely straight, e.g. has a certain curvature. Other errors in forming the image can also be introduced and it is desirable to provide a projection system and process which is capable of eliminating these errors.

A starting point for such correction is, of course, the detection of the error, at the image side of the system, so that changes can be made in the projection system to rectify the error.

It is known, in this connection, to provide an electronic shadow exposure system in which a divergent electron beam from an electric source is trained upon a surface formed with a hexagonal opening. By means of a collimator lens which surrounds the opening , a parallel beam can be generated which extends along the axis of the optical column.

In a so-called deflection region, two deflection systems are provided. By means of a first deflection system, the beam is scanned parallel to the beam axis transversely over the mask surface. By means of a second deflection system, the beam is tilted about a deflection axis lying in the mask plane so that it impinges upon the mask at an angle offset by 90° from the original beam axis, thereby dynamically shifting the image of the mask opening or individual images of the edge of the overall structure.

It is thus possible to form images on the substrate which are shifted by small amounts by tilting of the beam directions during scanning, from the image positions which might otherwise result without this tilting action.

If one applies a constant tilt to the scanning beam, it is possible to shift the entire mask image on the substrate.

Utilizing this principle, it is possible to compensate for position deviations of the table which carries the substrate. If one also changes the tilt of the beam during the scanning operation, it is also possible to achieve a slight degree of rotation of the image to compensate for errors for table vibration or the like.

The known system for this purpose also permits, by a corresponding tilting of the beam, a modification of the image in nonlinear manner during the shadow exposure and this permits compensation of mask distortion during substrate exposure.

Notwithstanding the fact that significant compensation of errors and distortion is possible with earlier systems, the apparatus involved and its manipulation is relatively complicated.

OBJECTS OF THE INVENTION

It is, therefore, the principal object of our present invention to provide a relatively simple apparatus capable of permitting correction of a projected image or changes in the projected image of a mask structure without drawbacks of earlier systems.

It is another object of the invention to provide an improved method of operating a particle beam projection system, especially an ion beam projection system, which permits correction utilizing relatively simple means.

SUMMARY OF THE INVENTION

These objects are attained, in the broadest sense, in accordance with the invention in an image-forming projector wherein a beam of charged particles, especially ions, is directed along a path through a mask defining a structure to be formed on a substrate and then through an electromagnetic lens, (e.g. a collimating and/or focusing lens) before the beam impinges upon the substrate to form an image of the mask structure thereon. According to this invention a controllable corrective element independent of the lens system is located along the path of the beam between the mask and the substrate and is formed with adjustable field-distribution means for generating electromagnetic fields differing controllably at various locations around the beam and corresponding to more than two, and preferably a large number, of distant electromagnetic potentials affecting the beam for deforming the beam and effecting a directed modification of the image of the mask transferred to the substrate.

In this connection, it should be noted that it is known (German Democratic Republic Patent No. 22 04 52) to provide a multipole in a corpuscular-optical projection apparatus which can permit only two possible states utilizing different electrical potentials to be created. This known multipole arrangement is intended to minimize aberrations of a rotationally symmetrical lens.

German Federal Republic Patent publications DE-OS No. 30 10 815 and DE-OS No. 33 45 573 disclose devices for improving the formation of particle bundles, especially for controlling the crossover region of the particles of a beam. In both cases, whatever corrective element is provided is disposed immediately downstream of the particle source or forms a part of this source.

The invention, therefore, deals with a projection device in which electrically charged particles, especially ions are intended to reproduce the structure of a projection mask on a substrate utilizing a beam of these particles which first traverses the mask and then passes through an ion-optical or electron-optical lens system. along the path of the beam between the mask and the lens system and is formed with adjustable field-distribution means for generating electromagnetic fields differing controllably at various locations around the beam and corresponding to more than two, and preferably a large number, of distant electromagnetic potentials affecting the beam for deforming the beam and effecting a directed modification of the image of the mask transferred to the substrate.

In this connection, it should be noted that it is known (German Democratic Republic Patent No. 22 04 52) to provide a multipole in a corpuscular-optical projection apparatus which can permit only two possible states utilizing different electrical potentials to be created. This known multipole arrangement is intended to minimize aberrations of a rotationally symmetrical lens.

German Federal Republic Patent publications DE-OS No. 30 10 815 and DE-OS No. 33 45 573 disclose devices for improving the formation of particle bundles, especially for controlling the crossover region of the particles of a beam. In both cases, whatever corrective element is provided is disposed immediately downstream of the particle source or forms a part of this source.

The invention, therefore, deals with a projection device in which electrically charged particles, especially ions are intended to reproduce the structure of a projection mask on a substrate utilizing a beam of these particles which first traverses the mask and then passes through an ion-optical or electron-optical lens system.

According to the invention, for effecting a deformation of the image of the mask structure which is received by the substrate, to correct the latter, between the mask and the lens system, a controllable corrective element is provided for generating a linear or nonlinear and, as required, also a nonrotationally symmetrical, electrical and/or magnetic-field distribution deriving from more than two electrical and/or magnetic potentials which are selectively applied. The controllable corrective element of the invention permits adjustment of the field distribution in such a way that the projection characteristics of various selected regions the complete image-carrying beam bundle in various selected regions are modified differently to thereby redirect the particle handle passing through the openings of the mask so that the resulting image structure corresponds to the desired virtual structure of the mask. For example, utilizing these principles we are able to transform a cushion or barrel distortion of the mask structure into undistorted images.

By contrast with conventional electron shadow-exposure systems, the method and apparatus of the invention permit a static correction so that a lens adjusted at the inception for a certain mask and/or a certain set of ion-optical or electron-optical parameters and layout of the exposure system can be maintained for a number of exposures utilizing the same mask. In the earlier or prior art system, dynamic distortion correction is required and effected, since during the scanning of the mask the beam must be repeatedly tilted in a variable manner. This requires a corrective element with at least four electrical and/or magnetic poles with each pole being controlled independently from the others and thus, for example, all four poles of an electrostatic quadrupole must be repeatedly and cyclically energized with various potentials. This, of course, creates problems in control when multiple exposures are required and, of course, in the complexity in the equipment required for even a single exposure.

With the invention, it is possible to compensate for lens related distortions of the projected image of the mask structure, e.g. errors resulting from production defects of the lenses by programming the corrective unit to permanently correct those errors associated with the lens system.

The invention, therefore, not only permits compensation of mask errors but also errors arising elsewhere in the ion-optical or electron-optical system.

Mention must be made of the fact that a static correction is already taught in German Democratic Republic Patent No. 22 04 52. In this case, an electrostatic multipole is used either alone or together with a lens system to minimize geometrical aberrations produced during exposure. This multipole comprises a tube of circular cross-section with two or more windows which are closed by metallic covers electrically insulated from the tube.

To the tube and the covers, different potentials can be applied, but all covers have the same potential. Such a multipole allows only two distinct potential values to be created and this, of course, will not permit the structure corrections which are possible with the present invention.

It may also be noted with the system of the invention that a distorted pattern can be applied to the substrate, starting from a nondistorted mask if that is desired.

Generally, in the use of such a projection to form integrated circuits by optical lithography, the projection apparatus will include, for example, optical wafer steppers which in successive steps allow the structures with different masks to be applied to different zones of the chip. The use of these wafer steppers may, however, pose problems when the registry cannot be effected with sufficient precision of the structures of different mask planes over the chip field. With the use of the device of the invention and the method described, it is possible to greatly improve the registration accuracy of multiple exposures.

The invention can also make ion-optical and electrical-optical projections compatible with light-optical and X-ray lithography units.

In accordance with the principles of this invention, the corrective lens with the desired adjustable field distribution can be located immediately downstream of the mask along the path of the particle beam. This permits especially simple control of any required corrections.

According to a further feature of the invention, the corrective lens with its adjustable field distribution has at least four and preferably in excess of 100 controllable electrical and/or magnetic poles. By a corresponding arrangement of the poles, it is possible to completely correct for anamorphic or cushion or arch barrel distortions including one-sided/ cushion-shaped, trapezoidal or rhomboidal patterns.

The invention also includes the method of operating the image-forming projector described which comprises the step of selectively and locally deforming the beam at a location between the mask and lens system and statically for at least a single full exposure of the image of the mask on the substrate by generating electromagnetic fields independent of the lens system and differing controllably at various locations around the beam and corresponding to more than two electromagnetic potentials effecting the beam for deforming the beam to effect a direct modification of the image of the mask transferred to the substrate.

The invention thus also involves the use of a controllable corrective element generating a linear or nonlinear and, when need arises, also a not rotationally symmetrical electric and/or magnetic field in a lens system along the path of a beam of electrically charged particles, especially ions, between a structure-defining mask and a substrate upon which an image of the mask structure is projected for directed controlled deformation of the image of the mask structure formed on the substrate.

BRIEF DESCRIPTION OF THE DRAWING

The above and other objects, features and advantages of the present invention will become more readily apparent from the following description, reference being made to the accompanying drawing, in which.

SPECIFIC DESCRIPTION

Figure 1:
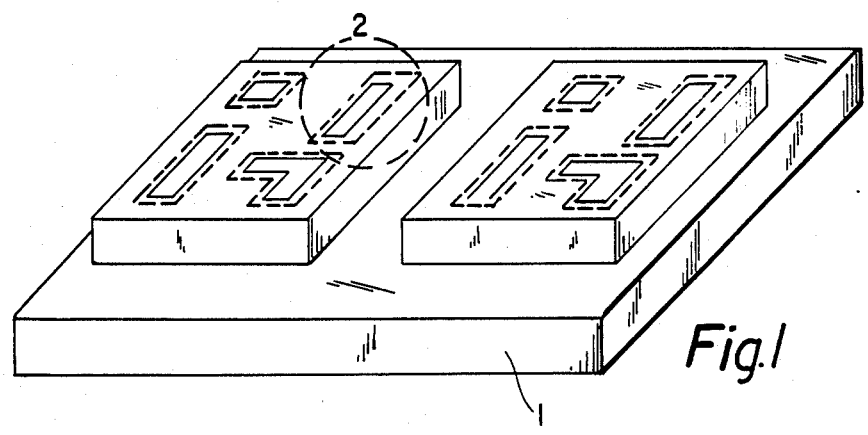
FIG. 1 is a perspective view showing two chip regions of a substrate upon which the structure of a mask is imaged in a step-and-repeat process.

FIG. 1 shows a substrate 1 upon which, in highly demagnified form, images of a mask structure are formed by, for example, ion-projection lithography.

The image of the first mask which is formed during the first exposure of the substrate 1, has been represented in broken lines.

After generating the first image on the substrate 1, using a second mask, a second image is generated which has been represented by continuous lines.

On the left-hand chip in FIG. 1 we have shown the case in which all of the structures exclusive of that in the right-upper corner register ideally so that a one-sided trapezoidal characteristic of the second image relative to the first is obtained. On the right-hand chip of FIG. 1 the effect of the invention has been shown and it is here seen in the right-upper corner that an ideal registry is obtained.

Figure 2:
FIG. 2 is a planar View diagrammatically showing the region II of FIG. 1.

FIG. 2 shows the detail II of FIG. 1 and from this FIG., it can be seen that the longitudinal symmetry of the line of the two rectangular images formed in successive steps are offset by a distance D.

This distance D is normally required to be less than 1/5 (one-fifth) to 1/10 (one-tenth) the minimum line width of the integrated circuit to be produced, especially when the minimum line width is, say, 0.1 to 0.3 micrometers as can be obtained with ion-projection lithography.

From this, it will be understood that a high precision must be obtained to ensure that the desired registration of successive images over the entire chip region is obtained.

Figure 3:
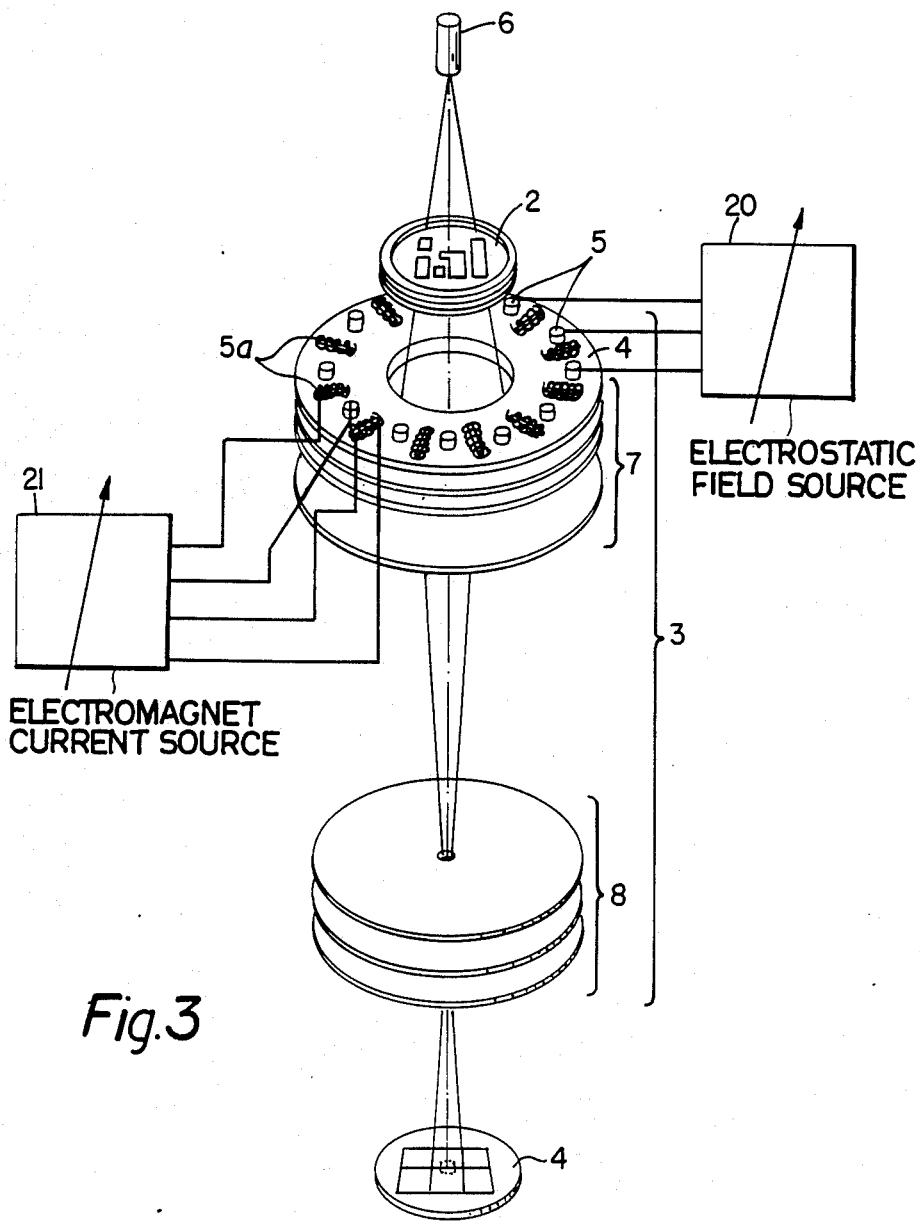
FIG. 3 is a diagrammatic perspective view of a projection apparatus provided with the corrective element according to the invention.

FIG. 3 shows the apparatus of the invention in the form of an ion-projection unit provided with a corrective element which can be employed in accordance with the invention to make the requisite corrections.

The apparatus comprises an ion source 6 generating a beam of ions along an axis.

Along the path of this beam, a mask 2 is provided and the mask is formed with windows defining the structure which is to be imaged on the substrate. While the mask 2 is shown in diagrammatic form, it is illustrated as intended to represent not only the mask itself but any holder for the mask which permits successive masks to be interposed in the path of the beam and any requisite means shifting the mask.

Downstream of the mask 2 along the beam is an ion-optical lens system which is represented at 3 and which directs the image-forming ion beam upon the substrate 1. The latter must be carried in an appropriate table and the apparatus must be provided with the usual indexing and positioning devices for step-and-repeat operations.

The ion-optical lens system can comprise, as in conventional ion-projection lithography apparatuses, an immersion lens 7 and a projection lens 8. In general terms, the lens system without the corrector element of the invention is provided to collimate and focus the beam and to define any cross-over of the latter to enable adjustment of the image size of the greatly demagnified image formed on the chip.

According to the invention and deviating from the prior art, we provide directly downstream of the mask 2 along the path of the beam, corrective element 4 which is capable of generating variable multipole-field distribution with more than two electromagnetic potentials for deflecting the beam in a static manner during the projection so as to make an appropriate correction.

The corrective element 4 with its adjustable-field distribution can be provided with circularly cylindrical electrodes 5 and magnetic poles 5a which are angularly equispaced in alternating relationship around the beam. Means is provided as represented by the electrostatic field source 20 and the magnet energization source 21 for varying the electrostatic potential at each electrode 5 in a way which will enable that potential to differ from all other electrodes 5 and energize the electromagnet coils of the poles 5a with different magnetic intensities from one another.

Thus the poles 5 and 5a at different potentials and with different coil currents are capable of simultaneously providing different deflection of different parts of the ion or electron beam bundle to compensate for defects in the mask structure or to accomplish desired deformation in the manner described.

Figure 4:
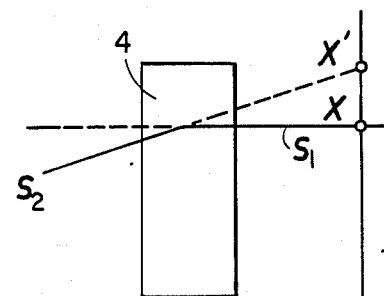
FIG. 4 is a diagram for illustrating the effect obtained with the invention.

In FIG. 4, for example, the mask plane has been represented at 2' and a pencil of ion or electron beam radiation traversing the point X of the mask has been represented at $S_1$. The deflection of this beam $S_1$ by the corrective element 4 is represented as the beam $S_2$. The pencil thus impinges upon the substrate as if it derived from the virtual point X' in the mask plane.

Thus by the use of the corrective element 4, a point X can be projected on the substrate to form an image which to all intents and purposes derives from the virtual point X'.

Figure 5:
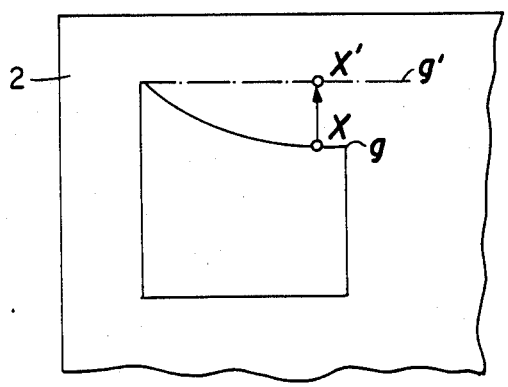
FIG. 5 shows the use of the method of the invention and the apparatus to change the pattern of an edge of an image.

If the point X, therefore, corresponds to a defect curve of the structure on the mask (FIG. 5) where the curved line is represented at g, the image which is produced on the substrate will have been corrected to conform to the straight line g' along which the virtual point X' lies. In this manner, the actual mask structure, which may not correspond to the ideal structure for the image, can be corrected for all subsequent exposures through this mask by a corresponding selection of the positions and electromagnetic fields for the individual poles of the corrective element. While in the illustration, only about two-dozen poles have been illustrated, it will be understood that in practice 100 poles or more may be provided.

We claim:

1. In an image-forming projector for controllably varying the image of the structure of a mask upon a substrate relative to one actual structure of the mask wherein a beam of charged particles is directed along a path to flood and impinge upon a mask defining a structure by an opening in said mask to be formed on a substrate, and then through an electromagnetic lens system before said beam impinges upon said substrate to form an image of the mask structure thereon, comprising:

a controllable corrective element independent of said lens system and located along the path of said beam formed with adjustable field-distribution means for generating static electromagnetic fields differing controllably at various locations around said beam and corresponding to more than two electromagnetic potentials affecting different ray portions of the beam passing through said opening in said mask for deforming said beam portions and a control means for controlling said corrective element for affecting a directed modification of the image of the structure of the mask transferred to said substrate relative to the actual structure of the mask.

2. The improvement defined in claim 1 wherein said electromagnetic fields are electrical fields.

3. The improvement defined in claim 1 wherein said electromagnetic fields are magnetic fields.

4. The improvement defined in claim 1 wherein said electromagnetic fields are mixed electrical and magnetic fields.

5. The improvement defined in claim 1 wherein said corrective element is constructed and arranged to generate a linear electromagnetic field distribution around said beam.

6. The improvement defined in claim 1 wherein said corrective element is constructed and arranged to generate a nonlinear electromagnetic field distribution around said beam.

7. The improvement defined in claim 1 wherein said corrective element is constructed and arranged to generate a nonlinear electromagnetic field distribution which is not rotationally symmetrical around said beam.

8. The improvement defined in claim 1 wherein said corrective element with said adjustable field-distribution means is located directly downstream of said mask along said path.

9. The improvement defined in claim 1 wherein said corrective element with said adjustable field-distribution means is provided with at least four electromagnetic poles spaced around said beam.

10. The improvement defined in claim 9 wherein said corrective element with said adjustable field-distribution means is provided with at least one hundred electromagnetic poles spaced around said beam.

11. The apparatus of claim 1 wherein said corrective element is located between said mask and said lens system.

12. A method of varying the image of a mask on a substrate relative to the actual structure of the mask in an image-forming projector wherein a beam of charged particles is directed along a path to flood a mask defining structures by openings in said mask to be formed on a substrate, and then through an electromagnetic lens system before said beam impinges upon said substrate to form an image of the mask structure thereon, comprising the step of:

selectively and locally deforming different ray portions of said beam passing through said openings in said mask by generating static electromagnetic fields independently of said lens system and differing controllably at various locations around said beam and corresponding to more than two electromagnetic potentials and controlling said fields for affecting the beam for deforming said beam portions to effect a directed modification of the image of the structure of the mask transferred to said substrate relative to the actual structure of the mask.

13. The improvement defined in claim 12 wherein said electromagnetic fields are electrical fields.

14. The improvement defined in claim 12 wherein said electromagnetic fields are magnetic fields.

15. The improvement defined in claim 12 wherein said electromagnetic fields are mixed electrical and magnetic fields.

16. The improvement defined in claim 12 wherein a linear electromagnetic field distribution is generated around said beam.

17. The improvement defined in claim 12 wherein a nonlinear electromagnetic field distribution is generated around said beam.

18. The improvement defined in claim 12 wherein a nonlinear electromagnetic field distribution which is not rotationally symmetrical is generated around said beam.

19. The improvement defined in claim 12 wherein said electromagnetic fields are formed by at least four electromagnetic poles spaced around said beam.

20. The improvement defined in claim 19 wherein said electromagnetic fields are formed by at least one hundred electromagnetic poles spaced around said beam.

21. The improvement defined in claim 19 wherein said electromagnetic poles are electrical poles generated by electrodes.

22. The improvement defined in claim 19 wherein said electromagnetic poles are magnetic poles generated by respective electromagnets.

23. A method of varying the image of a mask on a substrate relative to the actual structure of the mask in an image-forming projector wherein a beam of charged particles is directed along a path through a mask defining structures by openings in said mask to be formed on a substrate, and then through a lens system before said beam impinges upon said substrate to form an image of the mask structure thereon comprising the steps of:

flooding said mask with said charged particles, providing a controllable corrective element capable of generating static linear, nonlinear and non-rotationally symmetrical fields along the path of said beam of electrically charged particles, and by use of said element controllably deforming the image of the mask structure formed on said substrate.

* * * * *

UNITED STATES PATENT AND TRADEMARK OFFICE
CERTIFICATE OF CORRECTION

PATENT NO. : 4,859,857

DATED : August, 22, 1989

INVENTOR(S) : Gerhard Stengl, et al.

It is certified that error appears in the above-identified patent and that said Letters Patent is hereby corrected as shown below:

Column 5, line 2, "one-sided/ cushion-shaped" should be --one-sided, cushion-shaped--

Column 5, line 64, "FIG." should be --FIGURE--.

Signed and Sealed this

Twenty-fifth Day of December, 1990

Attest:

HARRY F. MANBECK, JR.

*Attesting Officer*          *Commissioner of Patents and Trademarks*